United States Patent [19]

Satou et al.

[11] 4,167,747
[45] Sep. 11, 1979

[54] COMPLEMENTARY MOSFET DEVICE AND METHOD OF MANUFACTURING THE SAME

[75] Inventors: Kazuo Satou, Yokohama; Mitsuhiko Ueno, Fujisawa, both of Japan

[73] Assignee: Tokyo Shibaura Electric Co., Ltd., Japan

[21] Appl. No.: 890,029

[22] Filed: Mar. 24, 1978

Related U.S. Application Data

[63] Continuation of Ser. No. 706,001, Jul. 16, 1976, abandoned.

[30] Foreign Application Priority Data

| Jul. 18, 1975 | [JP] | Japan | 50/87395 |
| Jul. 18, 1975 | [JP] | Japan | 50/88064 |
| Jul. 18, 1975 | [JP] | Japan | 50/88065 |
| Jul. 18, 1975 | [JP] | Japan | 50/88066 |

[51] Int. Cl.² .......................................... H01L 27/02
[52] U.S. Cl. ........................................ 357/42; 357/23; 357/41; 357/48
[58] Field of Search ................... 357/23, 41, 42, 48

[56] References Cited

U.S. PATENT DOCUMENTS

| 3,934,159 | 1/1976 | Nomiya et al. | 357/42 |
| 3,955,210 | 5/1976 | Bhatia et al. | 357/42 |

OTHER PUBLICATIONS

RCA-Tech. Notes-No. 876-Feb. 1971-Dennehy.

Primary Examiner—Edward J. Wojciechowicz
Attorney, Agent, or Firm—Finnegan, Henderson, Farabow & Garrett

[57] ABSTRACT

A CMOS device comprising an N type semiconductor substrate, a P type well region diffused in the substrate, an n-channel MOS transistor formed in the P type well region, and a p-channel MOS transistor formed in the N type semiconductor substrate, and a method for manufacturing the CMOS device. In case the CMOS device serves as a CMOS inverter, the source region of the p-channel MOS transistor, the semiconductor substrate and the well layer constitute a parasitic PNP type bipolar transistor, and the source region of the n-channel MOS transistor, the well layer and the semiconductor substrate constitute a parasitic NPN type bipolar transistor. The product of the current amplification factor $\beta_1$ of the PNP type bipolar transistor and the current amplification factor $\beta_2$ of the NPN type bipolar transistor is smaller than 1.

1 Claim, 8 Drawing Figures $B_2'$ : CURRENT AMP. FACTOR WHEN Au IS DOPED.

$B_2$ : CURRENT AMP. FACTOR WHEN Au IS NOT DOPED.

COMPLEMENTARY MOSFET DEVICE AND METHOD OF MANUFACTURING THE SAME

This is a continuation, of application Ser. No. 706,001, filed July 16, 1976.

This invention relates to a complementary MOSFET (hereinafter called CMOS) device in which abnormal current is prevented from being generated by parasitic bipolar transistors.

Hitherto various circuits constituted by CMOS's have been known. A typical example is a CMOS inverter circuit. As well known, a CMOS inverter circuit is constituted by a p-channel MOS transistor and an n-channel MOS transistor. The threshold voltage of one of these MOS transistors has the opposite characteristics to that of the other MOS transistor. For this reason, generally only one of the two MOS transistors is switched on in reponse to input information. Thus no current flows between the power sources of the CMOS inverter circuit, except during the transient period of the input information pulse. Thus, almost no operation power needs to be consumed, except that during the transient period of the pulse, both MOS transistors are switched on but for a moment, thereby causing only a transient current for a moment, that a leak current occurs at the PN junction, and that a current flows due to charge or discharge of a storage capacitor at the output terminal of the CMOS inverter circuit.

However, when noise is applied impulsively to the output or input of such a CMOS circuit system, an abnormally large DC current of tens of mA to hundreds of mA flows between the positive and negative power sources of the CMOS circuit. Even after removing the noise, such abnormal current is observed to keep flowing regularly. This regular flow of the abnormally large current sometimes causes the CMOS circuit connection to be melt and thus cut. The impulse corresponding to the noise has both polarities, positive and negative, and serves to generate an abnormal current. To remove this abnormal current it is necessary either to lower the power source voltage below a specific value or to disconnect the CMOS circuit system from the power source.

Accordingly, an object of the invention is to provide a CMOS device in which an abnormally large current is prevented from being generated by impulse noise and thus from flowing.

Another object of the invention is to provide a CMOS device in which the circuit connection is never melted nor even if impulse noise is applied.

Still another object of the invention is to provide a CMOS device which can keep operating with a low power consumption even if an impulse noise signal is applied.

According to the invention, in a semiconductor device comprising a semiconductor substrate of one conductivity type, a well layer of the opposite conductivity type formed in the semiconductor substrate, an MOS transistor of one channel type formed in the semiconductor substrate and another MOS transistor of the opposite channel type formed in the well layer, there are constituted a parasitic lateral transistor whose emitter, base and collector regions are respectively the source region of the MOS transistor of one channel type, the semiconductor substrate and the well layer and a parasitic vertical transistor whose emitter, base and collector regions are respectively the source region of the MOS transistor of the opposite channel type, the well layer and the semiconductor substrate, thereby providing a CMOS device in which the product of the current amplification factor $\beta_1$ of the lateral transistor and the current amplification factor $\beta_2$ of the vertical transistor is smaller than 1.

Further according to the invention there is provided a method for manufacturing a CMOS device, comprising a step of forming a semiconductor substrate of one conductivity type, a step of forming, by diffusion, a well layer of the opposite conductivity type in the semiconductor substrate, a step of forming an MOS transistor of one channel type in the semiconductor substrate, a step of forming another MOS transistor of the opposite channel type in the well layer, and a step for making less than 1 the product of the current amplification factor $\beta_1$ of a parasitic lateral transistor whose emitter, base and collector regions are respectively the source region of the MOS transistor of one channel type, the semiconductor substrate and the well layer and the current amplification factor $\beta_2$ of a parasitic vertical transistor whose emitter, base and collector regions are respectively the source region of the MOS transistor of the opposite channel type, the well layer and the semiconductor substrate.

This invention can be more fully understood from the following detailed description when taken in conjunction with the accompanying drawings, in which.

The invention shall now be explained in detail with reference to the accompanying drawings.

Figure 1:
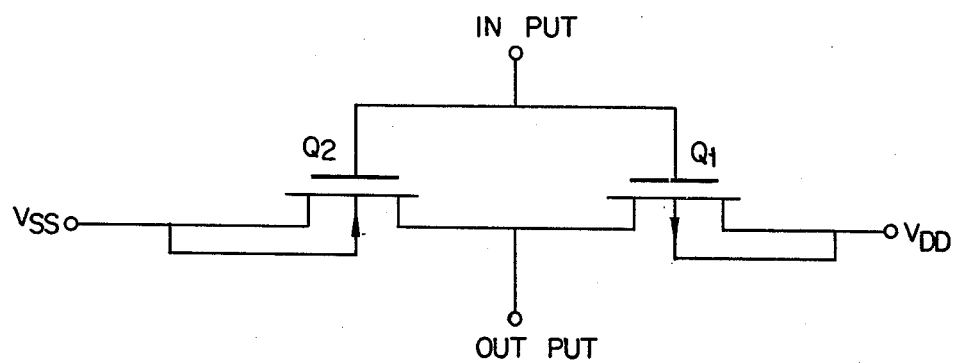
FIG. 1 is a circuit diagram of an inverter constituted by CMOS's.

The CMOS inverter circuit illustrated in FIG. 1 is comprised of a p-channel MOS transistor $Q_1$ and n-channel MOS transistor $Q_2$. The source electrode of the MOS transistor $Q_1$ is connected to the positive power source $V_{DD}$, while the drain electrode thereof is connected to the output terminal, jointly with the drain electrode of the MOS transistor $Q_2$. The source electrode of the MOS transistor $Q_2$ is connected to the negative power source $V_{SS}$. The gate electrodes of the MOS transistors $Q_1$ and $Q_2$ are coupled to each other so as to form the input terminal of the CMOS inverter circuit.

Figure 2:
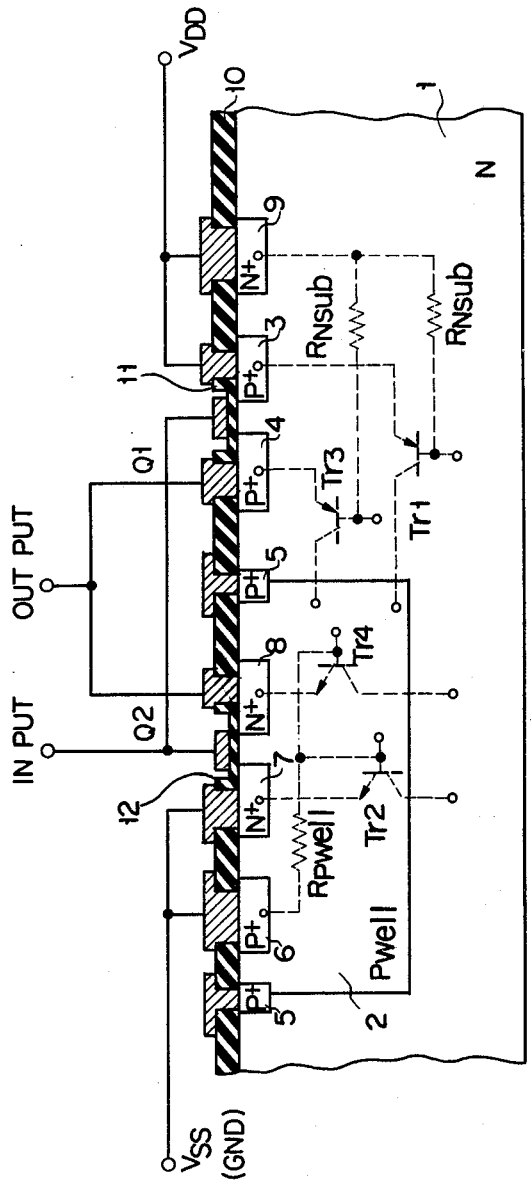
FIG. 2 is a cross-sectional side view of one embodiment of the semiconductor device to explain the present invention.

FIG. 2 shows one embodiment of the semiconductor device according to the invention, wherein the CMOS inverter circuit shown in FIG. 1 is formed in a semiconductor wafer. The substrate 1 of the embodiment is an N type silicon substrate with an N type impurity, for example phosphorus, doped in concentration of about $1 \times 10^{15}$ atoms/cm$^3$. From the surface of the N type silicon substrate 1 a P type impurity, for example boron, is diffused into a portion of the substrate 1 in concentration of about $2 \times 10^{16}$ atoms/cm$^3$, thereby forming a P well layer 2. Further, boron is diffused into the N type substrate 1, the P well layer 2 and the junction edges between the N type substrate 1 and the P well layer 2, in concentration of about $10^{19}$ atoms/cm$^3$, thereby simultaneously forming in the N type substrate 1 a P+ type source region 3 and a P+ type drain region 4 which constitute a p-channel MOS transistor Q$_1$, a P+ type conductive coupling region 6 in the P well layer, and P+ type guard rings 5 in the junction edges between N type substrate 1 and the P well layer 2. Therefore, phosphorus is diffused into the P well layer 2 and the N type substrate 1 in concentration of about $10^{20}$ atoms/cm$^3$, thereby forming simultaneously an N+ type source region 7 and an N+ type drain region 8 which constitute an n-channel MOS transistor Q$_2$ in the P well layer 2 and an N+ type conductive coupling region 9 in the N type substrate 1. This done, the field silicon oxide 10 is formed on the entire surface of the substrate 1.

Thereafter, in order to form gate regions of the MOS transistors Q$_1$ and Q$_2$, photo-etching is conducted on the substrate 1, thereby making holes in the field oxide film 10. At the bottoms of these holes gate oxide films 11 and 12 having a thickness of 1500 Å are formed by oxidizing the holes at a high temperature. Then in order to effect such a circuit connection as shown in FIG. 1, contact holes of predetermined sizes are bored in the silicon oxide film 10, and a conductive film of, for example, aluminum is deposited all over the surface of the substrate 1. The conductive film is then cut in a specific pattern so as to connect the P+ type drain region 4 and the N+ type drain region 8 to each other and connect the gate regions (or oxide films) 11 and 12 to each other. Thus, the drain regions 4 and 8 form an output terminal, and the gate regions 11 and 12 an input terminal. At the same time the P+ type conductive coupling region 6 and the N+ type conductive coupling region 9 are connected to the negative power source V$_{SS}$ (ground) and the positive power source V$_{DD}$, respectively. Further, if necessary, a silicon oxide film may be laid by chemical epitaxial growth on the entire surface, except for desired portions, of the aluminum conductive film so as to protect the aluminum conductive film and enhance the reliability of the semiconductor device. Though not shown in FIG. 2, a stopper may be disposed between the MOS transistors Q$_1$ and Q$_2$.

When noise is applied impulsively to the output or input of the semiconductor device which is so constituted as mentioned above and which serves as a CMOS inverter circuit, an abnormal current of 10 mA to 100 mA does flow. The inventors of the present invention have closely observed and studied this phenomenon. Finally the invertors have found out that when an impulse noise current is applied to the semiconductor device, a specific thyristor circuit is formed in the semiconductor device, as depicted by dotted lines in FIG. 2. Namely, four kinds of parasitic bipolar transistors are formed in the semiconductor substrate 1. More specifically, a PNP lateral transistor Tr$_1$, whose emitter, base and collector are the source region 3 of the p-channel MOS transistor Q$_1$, the N type semiconductor substrate 1 and the P well layer 2, respectively, is formed in the direction parallel to the surface of the substrate 1. An NPN vertical transistor Tr$_2$, whose emitter, base and collector are the N+ type source region 7 of the n-channel MOS transistor Q$_2$, the P well layer 2 and the N type semiconductor substrate 1, respectively, is formed in the direction perpendicular to the surface of the substrate 1. Similarly, a PNP lateral transistor Tr$_3$, whose emitter, base and collector are the P+ type drain region 4 of the p-channel MOS transistor Q$_1$, the N type semiconductor substrate 1 and the P well layer 2, respectively, is formed in the direction parallel to the surface of the substrate 1. And an NPN vertical transistor Tr$_4$, whose emitter, base and collector are the N+ type drain region 8 of the n-channel MOS transistor Q$_2$, the P well layer 2 and the N type semiconductor substrate 1, respectively, is formed in the direction perpendicular to the surface of the substrate 1.

In the semiconductor device shown in FIG. 2 the collectors of the lateral transistors Tr$_1$ and Tr$_3$ and the bases of the vertical transistors Tr$_2$ and Tr$_4$ are constituted commonly by the P well layer 2. Thus, they are connected to one another and to the negative power source V$_{SS}$ (that is, grounded) through a resistance R$_P$ $_{well}$ and the P+ type conductive coupling region 6 both formed in the P well layer 2. On the other hand, the bases of the lateral transistors Tr$_1$ and Tr$_3$ and the collectors of the vertical transistors Tr$_2$ and Tr$_4$ are constituted commonly by the semiconductor substrate 1. They are therefore connected together and to the positive power source V$_{DD}$ through a resistance R$_{Nsub}$ and the N+ type conductive coupling region 9 both formed in the semiconductor substrate 1. Further, the emitters of the transistors Tr$_3$ and Tr$_4$ are connected to the output terminal OUTPUT, and the emitters of the transistors Tr$_1$ and Tr$_2$ are connected to the positive power source V$_{DD}$ and the negative power source V$_{SS}$, respectively.

Figure 3:
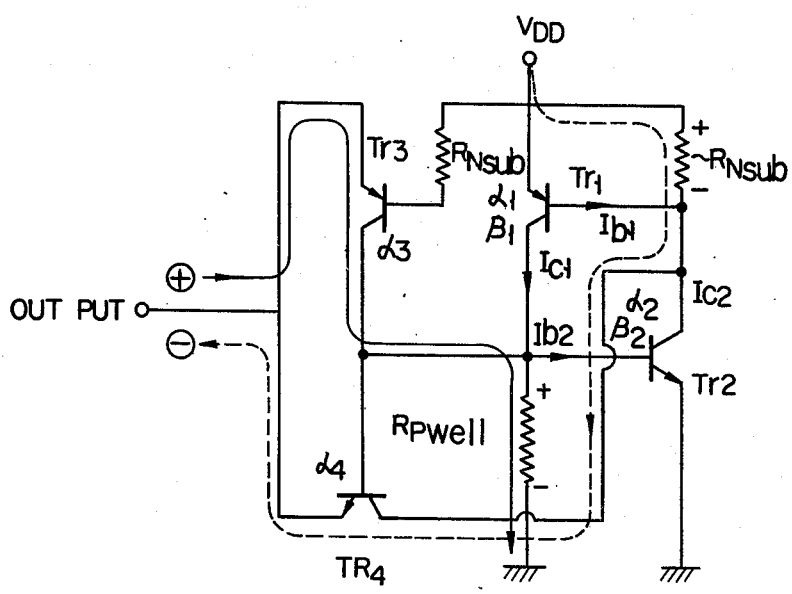
FIG. 3 shows an equivalent circuit diagram to a thyristor circuit in the form of a CMOS circuit semiconductor device.

The connection of the lateral and vertical transistors being as such, the thyristor circuit formed in the CMOS circuit device of FIG. 2 and indicated in dotted lines in FIG. 2 can be expressed as such an equivalent circuit as illustrated in FIG. 3. With reference to FIG. 3, it shall be explained how the thyristor formed in the CMOS circuit device shown in FIG. 2 operates. In the following explanation, "α" denotes a current amplification factor which is a bipolar transistor term generally employed to mean the ratio of collector current to the emitter current, "β" a current amplification factor, i.e. the ratio of the collector current to the base current $$(\beta = \frac{\alpha}{1 - \alpha}),$$

and "I" current. Similarly, "e", "b" and "c" stand for emitter, base and collector, respectively, and employed as suffix signs. Further, suffix numerals are used thereby to denote the transistors indicated by the corresponding numerals. In addition "r" is employed to denote the internal resistance of each transistor.

In FIG. 3, when a positive impulse noise current I$_{in}$ is applied to the output terminal as shown by the solid arrow, current of $\alpha_3 \times I_{in}$ flows in the collector of the transistor Tr$_3$. The current of $\alpha_3 \times I_{in}$ then flows through the resistance R$_P$ $_{well}$ of the P well layer 2, which serves as a by-pass. When the voltage across the resistance becomes over the threshold voltage $V_{bc2}$ between the base and emitter of the transistor $Tr_2$, the transistor $Tr_2$ is rendered conductive, and base current $I_{b2}$ flows through its base. The resistance $R_{P\,well}$ in the P well layer is far greater than the internal resistance rbe2 between the base and emitter of the transistor $Tr_2$. For this reason, the collector current $\alpha_3 \times I_{in}$ of the transistor $Tr_3$ hardly flows through the resistance $R_{P\,well}$. Consequently, the base current $I_{b2}$ of the transistor $Tr_2$ is almost equal to the collector current $\alpha_3 \times I_{in}$ of the transistor $Tr_3$. Namely, $$I_{b2} \simeq \alpha_3 I_{in} \quad (R_{P\,well} > > \text{rbe2}) \tag{1}$$

$$I_{c2} = \beta_2 I_{b2} = \beta_2 \alpha_3 I_{in} \tag{2}$$

Similarly, when the collector current $I_{c2}$ of the transistor $Tr_2$ acts as drive current and the voltage at both terminals of the resistance $R_{Nsub}$ of the substrate rises to the threshold voltage $V_{be1}$ between the base and emitter of the transistor $Tr_1$, the transistor $Tr_1$ is rendered conductive. Thus a base current $I_{b1}$ flows through the base of the transistor $Tr_1$. The base current $I_{b1}$ is nearly equal to the collector current $I_{c2}$ of the transistor $Tr_2$ since the resistance of $R_{Nsub}$ is extremely greater than the internal resistance rbe1 between the base and emitter of the transistor $Tr_1$. That is, $$I_{b1} \simeq I_{c2} (R_{Nsub} > > \text{rbe1}) \tag{3}$$

$$I_{c1} = \beta_1 I_{b1} = \beta_1 I_{c2} = \beta_1 \beta_2 \alpha_3 I_{in} \tag{4}$$

When the MOS transistors $Tr_1$ and $Tr_2$ are made conductive, current flows between the positive power source $V_{DD}$ and the ground through these transistors $Tr_1$ and $Tr_2$. In other words, when an impulse noise is applied to the CMOS inverter circuit, an abnormal current flows between the positive power source $V_{DD}$ and the ground through the semiconductor substrate 1 and the P well layer 2.

To keep a current flow between the positive power source $V_{DD}$ and the ground even after the noise application is stopped, it is required that the loop circuit constituted by the transistors $Tr_1$ and $Tr_2$ should perform a positive feedback operation. This is achieved only if the base current $I_{b2}$ of the transistor $Tr_2$ which is rendered conductive first when the impulse noise is applied is made equal to or smaller than the collector current $I_{c1}$ of the transistor $Tr_1$ which is rendered conductive after the transistor $Tr_2$. That is, $$I_{b2} \leq I_{c1} \tag{5}$$

Namely,
$$I_{b2} = \alpha_3 I_{in} \leq \beta_1 \beta_2 \alpha_3 I_{in}$$

Therefore,
$$1 \leq \beta_1 \beta_2 \tag{6}$$

From formula (6) it is understood that when the product of the current amplification factors $\beta_1$ and $\beta_2$ of the transistor $Tr_1$ and $Tr_2$ is equal to or larger than 1, an abnormal current keeps flowing between the positive power source $V_{DD}$ and the ground of the CMOS inverter circuit.

So long as the product of $\beta_1$ and $\beta_2$ is larger than 1, in the loop circuit including the transistors $Tr_1$ and $Tr_2$ the base current $I_{b2}$ in a specific cyclic period becomes greater than the base current $I_{b2}$ in the preceding cyclic period. Thus, the more times the current flows cyclically in the loop circuit, the greater the current between the power source $V_{DD}$ and the ground becomes. But the current does not increase indefinitely. The current amplification factor $\beta$ of a transistor is a function to current, and its value increases with the current. However, it starts growing smaller one when it has reached a maximum value, $\beta$ max. For this reason, the abnormal current flowing between the positive power source $V_{DD}$ and the ground of the CMOS inverter circuit is eventually maintained at a specific value, i.e. point of balance between the current increase effected by the loop circuit and the current decrease achieved by the reduction of current amplification factor. Namely, usually the abnormal current comes to have such a value as is defined when the following two conditions are satisfied at the same time:

a. $I_{b2}(n-1) = I_{b2}(n)$ b. $\beta_1(n) \cdot \beta_2(n) \geq 1$, where "n" denotes the number of cyclic periods during which the abnormal current flows in the loop circuit.

The size of a transistor does not make a primary factor of the possibility of an abnormal current flow. But when the current amplification factor $\beta$ of the transistor was measured with the size of the transistor (strictly speaking, the drain area) as parameter, it was ascertained that there existed an interrelationship between the size of the transistor and the current value at which the abnormal current was finally maintained. This fact indicates that the larger is the drain area of a transistor, the greater is the abnormal current.

When a negative impulse noise is applied to the output of the CMOS inverter circuit as shown in FIG. 3, such current as indicated by the dotted-line arrow flows between the positive power source $V_{DD}$ and the output terminal OUTPUT, and the following formulas are established similarly as in case a positive impulse noise is applied to the output terminal:

$$I_{b1} \simeq \alpha_4 I_{in} (R_{Nsub} \geq \text{rel}) \tag{7}$$

$$I_{c1} = \beta_1 I_{b1} = \beta_1 \alpha_4 I_{in}$$

$$I_{b2} = I_{c1} (R_{Pwell} > > \text{rbe2}) \text{ and}$$

$$I_{c2} = \beta_2 I_{b2} = \beta_2 \beta_1 I_{b1} = \beta_1 \beta_2 \alpha_4 I_{in}$$

To maintain current in the circuit constituted by the transistors $Tr_1$ and $Tr_2$ it is required that the collector current $I_{c2}$ of the transistor $Tr_2$ which is rendered conductive after the transistor $Tr_1$ should be greater than the base current $I_{b1}$ of the transistor $Tr_1$. That is, $$I_{b1} \leq I_{c2} \tag{8}$$

In order to maintain an abnormal current in the CMOS inverter circuit in case a negative noise is applied thereto, it is required as in case a positive noise is applied that the following formula be established:

$$1 \leq \beta_1 \beta_2 \tag{6}$$

Thus it is ascertained that to avoid generation of an abnormal current and perpetual flow of the same in such a thyristor circuit as illustrated in FIGS. 2 and 3 it is sufficient to keep smaller than 1 the products of the current amplification factors $\beta_1$ and $\beta_2$ of the transistors Tr$_1$ and Tr$_2$. To generalize it, in order to prevent generation of an abnormal current and a perpetual flow thereof in a CMOS inverter due to the operation of a thyristor circuit, it is sufficient to hold less than 1 the product of the current amplification factors $\beta$ of a lateral transistor formed substantially in parallel to the surface of the semiconductor substrate and a vertical transistor formed perpendicular to the surface of the semiconductor substrate.

The inventors of the present invention have found that to satisfy this requirement in practice, the following measures are effective:

(1) To increase the base width of one or both of the lateral and vertical transistors.

(2) To conduct a heat treatment on the semiconductor substrate during the manufacture process, thereby to shorten the life time of the carrier in the substrate.

(3) To shorten the life time of the carrier in the semiconductor wafer on which the substrate is formed.

(4) To dope the semiconductor substrate with gold.

Four embodiments (1) to (4) of the invention shall be explained, in which the above-noted measures (1) to (4) are taken, respectively.

EMBODIMENT (1)

Figure 4:
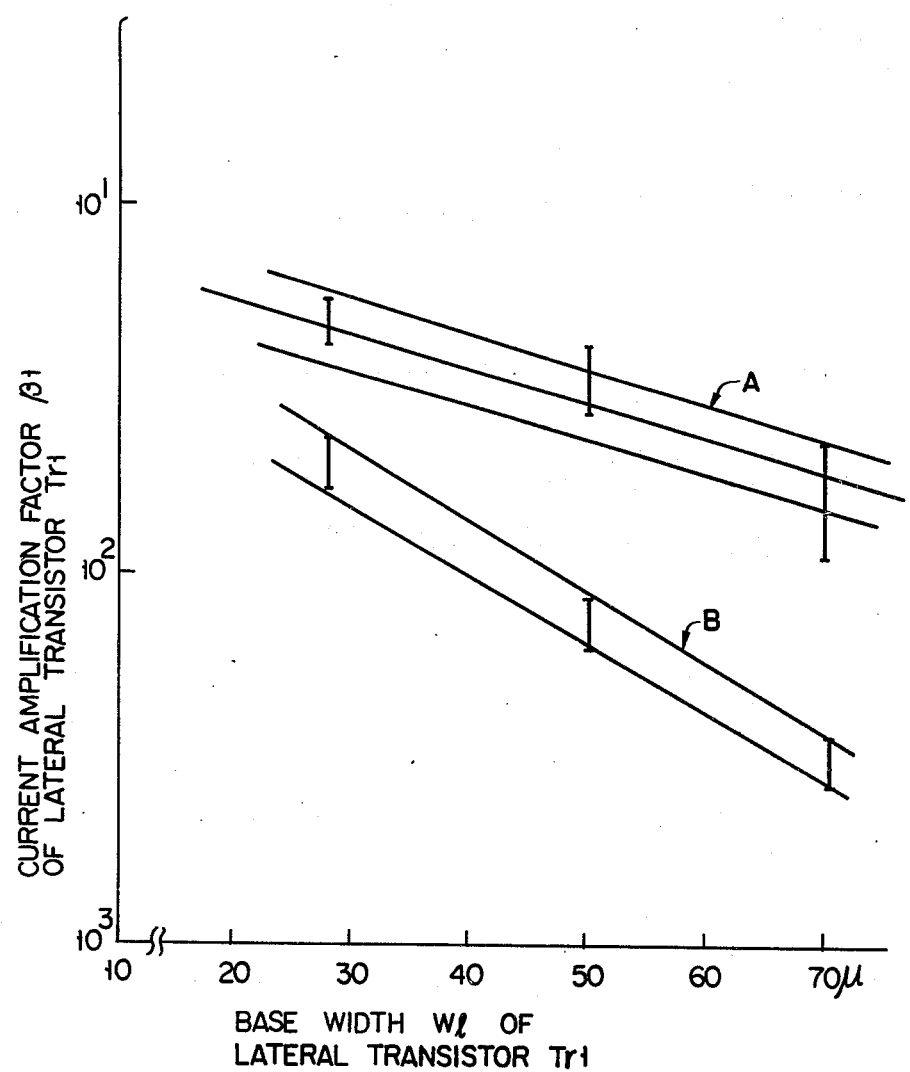
FIG. 4 is a diagram indicating the dependence of the current amplification factor of a lateral transistor having an N substrate as its base on the base width thereof.

In the diagram of FIG. 4, plotted on the axis of ordinate is the current amplification factor $\beta_1$ of the lateral transistor Tr$_1$. In logarithmic notation, and plotted on the axis of abscissa is the base width W$_l$($\mu$) of the lateral transistor Tr$_1$, i.e. the distance between the edge of the P well layer 2 and the edge of the source region 4 of the p-channel MOS transistor Q$_1$ formed in the portion of the semiconductor substrate 1 other than the P well layer 2. The diagram shows that as the base width W$_l$ increases, the current amplification factor $\beta_1$ becomes smaller. The length of each vertical line in FIG. 4 indicates the range within which the current amplification factor $\beta_1$ varies according to individual wafers and the position within the same wafer when the factor is measured, though the base width W$_l$ is one and the same.

Figure 5:
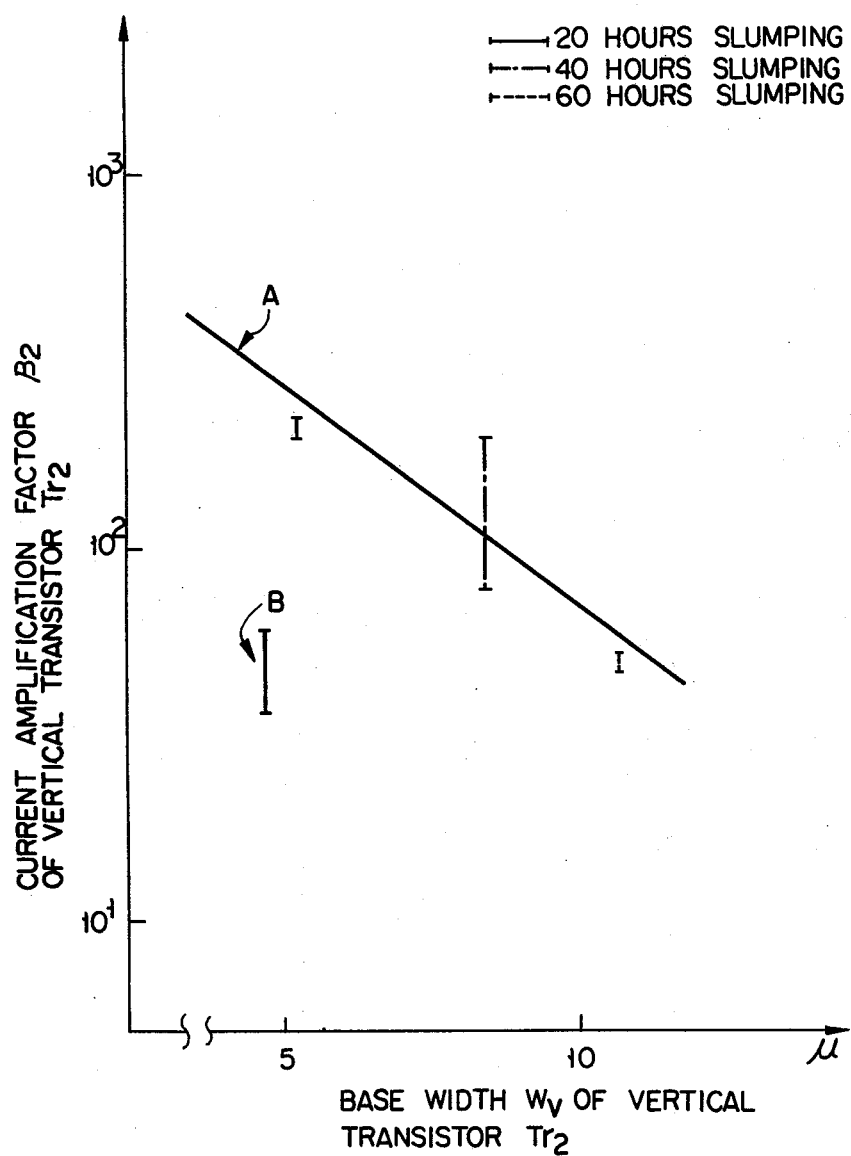
FIG. 5 is a diagram indicating the dependence of the current amplification factor of a vertical transistor having a P well layer as its base on the base width thereof.

In the diagram of FIG. 5, plotted on the axis of ordinate is the current amplification factor $\beta_2$ of the vertical transistor Tr$_2$ in logarithmic notation, and plotted on the axis of abscissa is the base width W$_v$($\mu$) of the vertical transistor Tr$_2$, i.e. the thickness of the P well layer 2 minus the thickness of the source region 7 of the n-channel MOS transistor Q$_2$ formed in the P well layer 2. This diagram teaches that as the base width W$_v$ increases, the current amplification factor $\beta_2$ becomes smaller. In FIG. 5 the length of each vertical line indicates the range within which the current amplification factor $\beta_2$ varies according to individual wafers and the position within the same wafer where the factor is measured, though the base width W$_v$ is the same. The length of vertical lines further indicate the variation of the current amplification factor $\beta_2$ when the doping amount of impurities is so regulated that the impurity concentration may become the same in case the slumping time, i.e. the period during which the wafer undergoes a heat treatment, varies as 20 hours, 40 hours and 60 hours, respectively, thereby causing a change of the base width W$_v$ of the vertical transistor Tr$_2$. Since the base width W$_v$ of the vertical transistor Tr$_2$ much depends on the thickness of the P well layer 2, it is influenced by the variation of the slumping time.

The relationship between the base width and the current amplification factor of the lateral or vertical transistor differs since the current amplification factor $\beta_1$ and $\beta_2$ varies according to the process of manufacturing the semiconductor device. For this reason, the straight lines A and B which show the relationship obtained from different experiments A and B using different semiconductor devices incline at different angles as shown in FIGS. 4 and 5. In FIG. 5, no other current amplification factor of the vertical transistor Tr$_2$ than indicated by the line B could not be measured.

Figure 6:
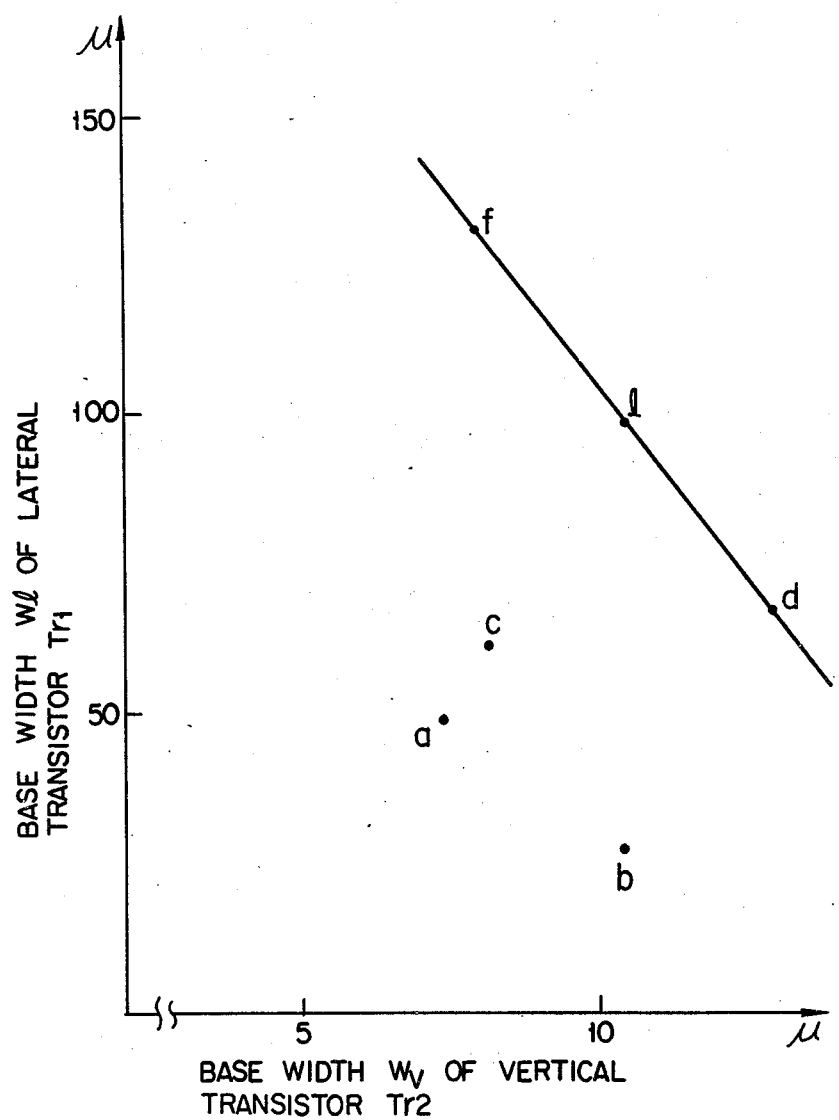
FIG. 6 is a diagram showing the dependence of the region where a latch up occurs on the base widths of both a parasitic lateral transistor and a parasitic vertical transistor.

In the diagram of FIG. 6, plotted on the axis of abscissa is the base width W$_v$ of the vertical transistor Tr$_2$, and plotted on the axis of ordinate is the base width W$_l$ of the lateral transistor Tr$_1$. In this embodiment, the P well layer was formed by diffusing, for example, boron into the semiconductor substrate. Its thickness was 12.5$\mu$ when the wafer slumping was conducted for 60 hours at 1200° C., 10.2$\mu$ when the wafer-slumping was conducted for 40 hours at the same temperature, and 7.2$\mu$ when the wafer-slumping conducted for 20 hours at the same temperature. The product of the current amplification factors $\beta_1$ and $\beta_2$ was 8.1 in a CMOS inverter circuit wherein the base widths W$_l$ and W$_v$ of the lateral and vertical transistors Tr$_1$ and Tr$_2$ were of such values as denoted at point (a) in FIG. 6. It was 4.8 and 1.0 in a CMOS inverter circuit in which the base widths W$_l$ and W$_v$ were of such values as denoted at points (b) and (c) and in a CMOS inverter circuit in which the base widths W$_l$ and W$_v$ were valued at points (d), (e) and (f), respectively. Any CMOS inverter circuit, wherein the base widths W$_l$ and W$_v$ have such values as denoted at a point located above the straight line on which points (d), (e) and (f) are aligned, had the product $\beta_1$ and $\beta_2$ smaller than 1. Thus no abnormal large current was observed to flow in such CMOS inverter circuit. By contrast, an abnormal current was observed to flow in the CMOS inverter circuits in which the base widths W$_l$ and W$_v$ of the lateral and vertical transistors Tr$_1$ and Tr$_2$ were at a point below said straight boundary line in FIG. 6. That is, the so-called "latch up" phenomenon was seen in these CMOS inverter circuits.

Consequently, an abnormal current can be prevented from occuring and flowing perpetually in the CMOS inverter circuit only if the thickness of the P well layer and/or the distance between the P well layer 2 and the source region 3 of the p-channel MOS transistor Q$_1$ is so selected that base widths W$_l$ and W$_v$ of the lateral and vertical transistors Tr$_1$ and Tr$_2$ may be located above the boundary line in FIG. 6 to make the product of the current amplification factors $\beta_1$ and $\beta_2$ smaller than 1. The boundary line may be shifted according to the process of manufacturing the CMOS semiconductor device. Thus it is not determined exclusively by such the exact position of the line as shown in FIG. 6 whether or not the product of the current amplification factors $\beta_1$ and $\beta_2$ is smaller than 1.

To expand the distance between the P well layer 2 and the P$^+$ type source region 3 of the p-channel MOS transistor Q$_1$ is to lower the current amplification factor $\beta_1$ of the lateral transistor Tr$_1$.

EMBODIMENT (2)

In the process of manufacturing CMOS inverter circuits, the heat treatment to shorten the life time of the carrier in the semiconductor substrate is effected after the formation of the gate oxide film.

According to the invention, in a semiconductor substrate of one conductivity type a well layer of the opposite conductivity type is formed by impurity diffusion. Then, in the well layer and the portion of the substrate other than the well layer a source region and a drain region are formed also by impurity diffusion. On each surface portion of the substrate, which corresponds to a gate region, an oxide film is laid. Thereafter, the semiconductor substrate is heated from 900° to 1250° C. in an inert atmosphere and maintained at the high temperature for about 10 minutes. Then it is rapidly cooled to room temperature or the temperature of liquid nitrogen. After completion of this heat treatment, electrode-connection is carried out in the ordinary manner, thereby to finish manufacturing a CMOS inverter.

In the CMOS transistors in a CMOS inverter which has undergone the above-noted heating and rapid cooling, the carriers in their substrates have a short life time. In fact, in the CMOS inverters manufactured in the above-mentioned method the current amplification factors $\beta_2$ and $\beta_4$ of the vertical transistors $Tr_2$ and $Tr_4$ were measured to be 56, and the current amplification factors $\beta_1$ and $\beta_3$ of the lateral transistors $Tr_1$ and $Tr_3$ to be $4 \times 10^{-2}$. Thus the product of $\beta_1$ and $\beta_2$ is smaller than 1, and an abnormal current can be prevented from flowing in the CMOS inverter even if an impulse noise is applied to the CMOS inverter. But when the above-mentioned heating and cooling were not carried out, the current amplification factors $\beta_2$ and $\beta_4$ of the vertical transistors $Tr_2$ and $Tr_4$ formed in the resultant CMOS inverter were measured to be 200, while the current amplification factors $\beta_1$ and $\beta_3$ of the lateral transistors $Tr_1$ and $Tr_3$ of the inverter were measured to be $5 \times 10^{-2}$. In this case the product of $\beta_1$ and $\beta_2$ becomes more than 1, and an abnormal current will inevitably flow in the CMOS inverter when an impulse noise is applied thereto.

EMBODIMENT (3)

After forming monocrystals in a semiconductor wafer, the wafer is to be heated to about 1100° C. thereby to correct the resistivity of the monocrystals. Conventionally, the temperature for such heat treatment is approximately 950° C. But it was found that when the semiconductor wafer was heated to 1100° C., the life time of the carriers in the wafer were shortened so much that the current amplification factor $\beta_1$ of the lateral transistor $Tr_1$ formed in the resultant CMOS device was lowered from $5 \times 10^{-2}$ to $1.4 \times 10^{-2}$ or $1.0 \times 10^{-2}$, and the current amplification factor $\beta_2$ of the vertical transistor $Tr_2$ from 200 to 56 or 40. Thus, the product of $\beta_1$ and $\beta_2$ became smaller than 1, and no abnormal current flowed in the CMOS device. The temperature for the heat treatment applicable in this embodiment ranges from 1000° C. to 1150° C., and a temperature from 1050° to 1150° C. is preferable, and the optimum temperature is 1100° C.

EMBODIMENT (4)

Figure 7:
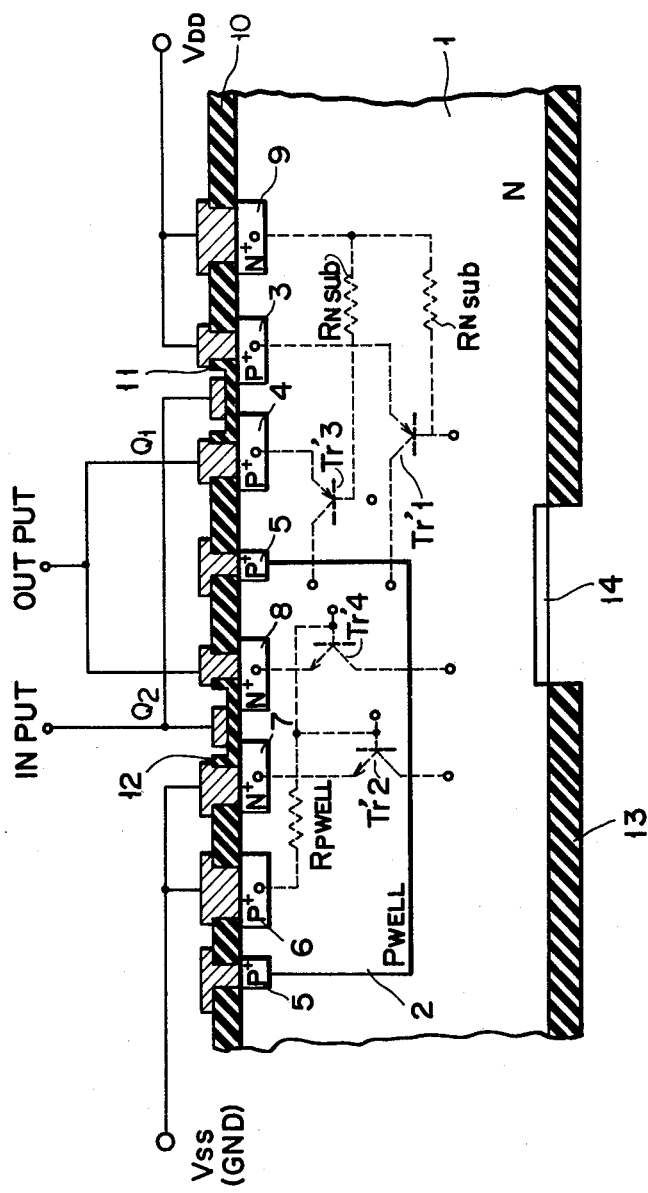
FIG. 7 is a cross-sectional side view of one embodiment of the semiconductor device according to the invention, with a gold layer laid on the back of the substrate.

In manufacturing such an embodiment of the CMOS semiconductor device as shown in FIG. 2, immediately after forming gate regions 11 and 12 the oxide film on the lower surface of the semiconductor substrate 1 is etched away. This done, the N type silicon 13 is partly etched away as illustrated in FIG. 7 to form a recess about 30μ deep in the lower surface of the substrate 1. On the bottom of the recess a gold film 14 is vapor-deposited. The vapor deposition is effected, using a gold wire having a diameter of, for instance, 1 mm while the substrate 1 is heated at room temperature, thus depositing a gold film 300 Å thick in said recess. Thereafter, the substrate 1 is kept in a dry nitrogen atmosphere at 1100° C. for 10 minutes, thereby diffusing the gold deep into the substrate 1. Then, the electrode-connection is made as explained before with reference to FIG. 2.

Figure 8:
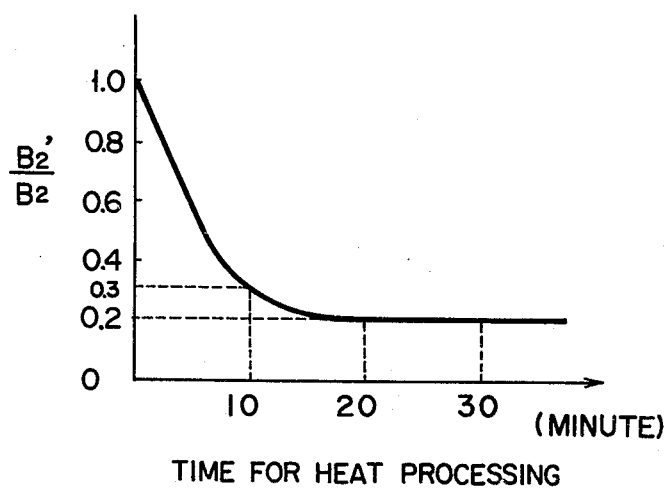
FIG. 8 is a diagram showing the relationship between current amplification factor and gold-doping into the semiconductor substrate.

In the diagram of FIG. 8, plotted on the axis of ordinate is the ratio of the current amplification factor $\beta_2'$ of the vertical transistor $Tr_2'$ formed in a CMOS semiconductor device doped with gold as shown in FIG. 7 to the current amplification factor $\beta_2$ of the vertical transistor $Tr_2$ formed in a CMOS semiconductor device not doped with gold, and plotted on the axis of abscissa is the time required for diffusing gold into the substrate 1. From this diagram it is understood that the ratio $\beta_2'/\beta_2$ decreases as the gold-doping time is longer. Namely, the longer is the gold-doping time, the smaller is the current amplification factor $\beta_2'$ of the vertical transistor $Tr_2'$. This trend appears more remarkably in the current amplification factor $\beta_1'$ of the lateral transistor $Tr_1'$ formed in the CMOS semiconductor device doped with gold. Owing to the gold-doping the product of $\beta_1'$ and $\beta_2'$ can be made smaller than 1. For example, if a CMOS semiconductor device wherein the product of $\beta_1$ and $\beta_2$ is $0.05 \times 200$ is doped with gold, the current amplification factor $\beta_2$ of the vertical transistor $Tr_2$ is reduced to 30%. In this case, the current amplification factor $\beta_1$ of the lateral transistor $Tr_1$ is believed to be reduced also to 30%. As a result, the product of $\beta_1$ and $\beta_2$ is reduced to 9% ($= 0.3 \times 0.3$). Consequently, it becomes smaller than 1; precisely it is 0.9 ($= (0.05 \times 200) \times 0.09$). Thus, if the CMOS semiconductor device is doped with gold, generation of an abnormal current and perpetual flow of the same in it can be avoided.

As explained above in detail, according to the present invention the product of the current amplification factors $\beta_1$ and $\beta_2$ of a lateral transistor $Tr_1$ and a vertical transistor $Tr_2$ formed in a CMOS semiconductor device is made smaller than 1, so that even if an impulse noise is applied to the CMOS semiconductor device, an abnormally large current is prevented from flowing between the positive power source $V_{DD}$ and the negative power source $V_{SS}$. For this reason the CMOS semiconductor device according to the invention consumes but a little power and is free of trouble such as melting-cutting of the circuit connection. To make the product of $\beta_1$ and $\beta_2$ smaller than 1, the base widths of the laterl and vertical transistors $Tr_1$ and $Tr_2$ are selected to be appropriate for the purpose. Further, to achieve the same object the substrate or the semiconductor wafer is heated and cooled in such a manner so as to shorten the life time of the carrier in it. Still further, to attain the same object the CMOS semiconductor substrate is doped with gold. Any one of, or any possible combination of these technical measures is taken in order to avoid a flow of an abnormally large current in the CMOS semiconductor device.

Needless to say, the CMOS semiconductor device according to this invention can constitute a variety of logic circuits such as AND circuits and NOR circuits in which no abnormal current would flow.

What we claim is:

1. A CMOS device comprising a semiconductor substrate of one conductivity type, a well layer of the opposite conductivity type formed in said semiconductor substrate, a first MOS transistor of one channel type comprising first drain and source regions formed in said substrate outside said well layer, a second MOS transistor of opposite channel type comprising second drain and source regions formed in said well layer, said substrate and said well layer respectively constituting, in the presence of impulse noise, the base region of first and second lateral parasitic bipolar transistors and the base region of first and second vertical parasitic bipolar transistors, said semiconductor substrate further comprising gold doping sufficiently to assure that the product of the current amplification factors $\beta_1$ of at least one of said lateral parasitic bipolar transistors and $\beta_2$ of at least one of said vertical parasitic bipolar transistors is smaller than 1.

* * * * *